United States Patent [19]

Lachiw et al.

[11] Patent Number: 4,835,608
[45] Date of Patent: May 30, 1989

[54] IMAGE TRAP FILTER CIRCUIT

[75] Inventors: Mark J. Lachiw, Park Ridge; Peter Strammello, Arlington Heights, both of Ill.

[73] Assignee: Zenith Electronics Corporation, Glenview, Ill.

[21] Appl. No.: 200,346

[22] Filed: May 31, 1988

[51] Int. Cl.⁴ ............................................. H04N 5/50
[52] U.S. Cl. .................... 358/191.1; 455/340; 455/197
[58] Field of Search ............... 358/191.1; 455/340, 455/307, 197, 193, 302

[56] References Cited

U.S. PATENT DOCUMENTS

| | | | |
|---|---|---|---|
| 3,562,417 | 2/1971 | Poppa | 455/307 X |
| 4,204,166 | 5/1980 | Araki | 455/340 X |
| 4,361,909 | 11/1982 | Theriault | 455/340 X |
| 4,368,541 | 1/1983 | Evans | 455/340 X |
| 4,399,559 | 8/1983 | Theriault | 455/179 |
| 4,601,062 | 7/1986 | Hettiger | 455/340 X |
| 4,662,001 | 4/1987 | Cruz et al. | 455/302 X |
| 4,760,535 | 7/1988 | Englmeier | 455/197 X |
| 4,771,332 | 9/1988 | Metoki | 358/191.1 |

FOREIGN PATENT DOCUMENTS

| | | | |
|---|---|---|---|
| 58-105614 | 6/1983 | Japan | 358/191.1 |
| 59-61284 | 4/1984 | Japan | 358/191.1 |
| 59-81927 | 5/1984 | Japan | 358/191.1 |
| 60-80325 | 5/1985 | Japan | 358/191.1 |

Primary Examiner—James J. Groody
Assistant Examiner—E. Anne Faris

[57] ABSTRACT

A varactor diode tuner includes a tunable image frequency trap in its input circuit. The trap is part of a tunable bandpass filter and forms a tapped capacitance matching network for UHF television signal carrier frequencies and a low impedance shunt at image frequencies. The trap is formed of discrete capacitors, an inductor and a tunable varactor diode.

4 Claims, 2 Drawing Sheets

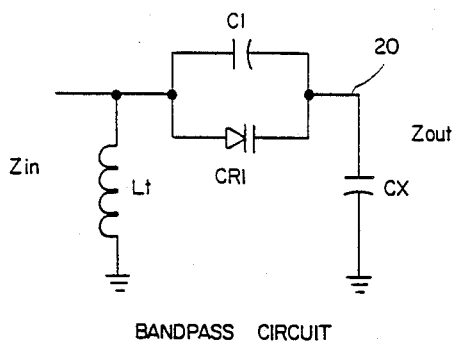

BANDPASS CIRCUIT

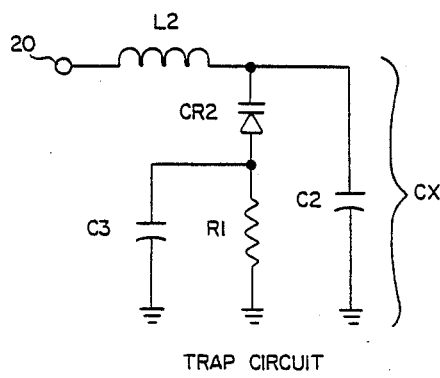

TRAP CIRCUIT

FIG. 3

$$F_{bp} = \frac{1}{2\pi\sqrt{L_t\left(\frac{(CR_1 + C_1)C_X}{CR_1 + C_1 + C_X}\right)}} \quad (1)$$

$$Z_{out} = \frac{Z_{in}}{\left(1 + \frac{CR_1 \cdot C_1}{C_X}\right)^2} \quad (2)$$

$$C_{total} = C_2 + \frac{CR_2 \cdot C_3}{CR_2 + C_3} \quad (3)$$

$$ZC_X = \frac{1}{jwC_X} = jwL_2 + \frac{1}{jwC_{total}}$$

$$C_X = \frac{C_{total}}{1 - w^2 L_2 C_{total}}$$

$$= \frac{C_2 + \frac{CR_2 \cdot C_3}{CR_2 + C_3}}{1 - w^2 L_2 \left(C_2 + \frac{CR_2 \cdot C_3}{CR_2 + C_3}\right)} \quad (4)$$

WHERE $w = 2\pi F_{bp}$ $$F_{trap} = \frac{1}{2\pi\sqrt{L_2 C_{total}}} \quad (5)$$

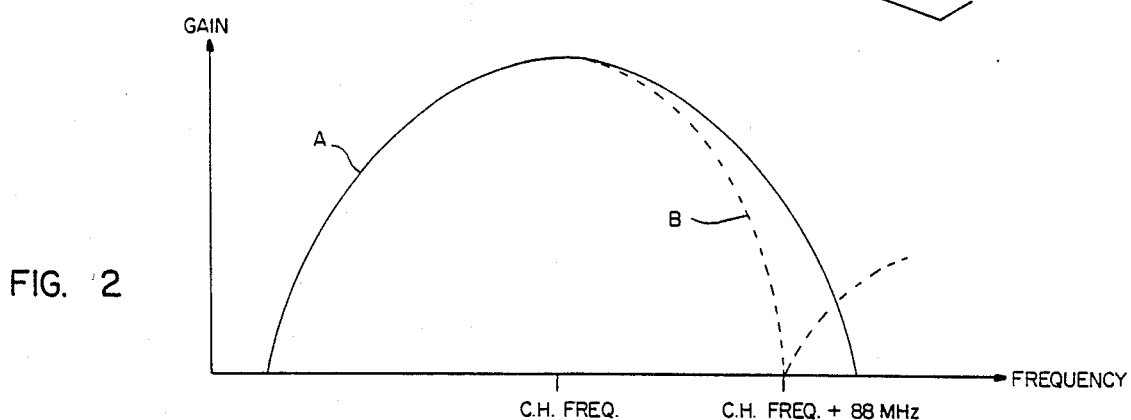

IMAGE TRAP FILTER CIRCUIT

BACKGROUND OF THE INVENTION AND PRIOR ART

This invention relates generally to superheterodyne television tuners and particularly to such television tuners that are used to receive and process ultra high frequency (UHF) television signals.

Varactor diode tuners of the superheterodyne type are well-known in the art. In such tuners, the capacitance of a varactor diode in a tuned circuit is controlled by a tuning voltage. The resonant frequency of the tuned circuit may be altered by changing the tuning voltage. Varactor diodes are incorporated in a number of tunable circuits in the tuner for selecting a desired television signal from among the gamut of available television signals. A desired signal is selected or filtered by the tuner antenna stage and the selected signal is amplified. The amplified signal is further filtered by the interstage and then applied to a mixer stage. The selected signal is mixed or heterodyned, in the mixer stage, with a locally generated oscillator signal to produce an intermediate frequency (IF) output signal of fixed frequency. The oscillator frequency is usually a predetermined amount above the desired television signal carrier frequency and the IF signal is developed in the mixer by heterodyning the incoming television carrier signal with the local oscillator signal. An input circuit and interstage circuit, generally comprising tunable bandpass filters, are utilized to select the desired television signal from among the gamut of available television signals and to pass it to the mixer stage.

In superheterodyne tuners, there is an ever present concern with so-called image frequency signals. Image frequency signals are undesired signals that, when mixed with the oscillator signal, also produce a signal at the IF frequency. If the IF frequency is 45 MHz for example, an image frequency would exist at 90 MHz from the channel frequency. Assume a channel frequency of 375 MHz, an IF frequency of 45 MHz and an oscillator frequency of 420 MHz. A frequency of 465 MHz (90 MHz higher than the channel frequency), heterodyning with the oscillator signal would also generate a 45 MHz output signal that would directly interfere with the desired IF frequency signal. The 465 MHz signal is at an image frequency and is, of course, undesirable.

In prior art tuner designs, image frequencies are either ignored or generally rejected by a trap filter in the tuner interstage circuit. It is believed that in prior art tuner designs, an image frequency trap could not be employed in the tuner input circuit without significantly affecting the tuner signal-to-noise ratio and tuner input standing wave ratio.

In accordance with the invention, a tunable image frequency trap is employed in the tuner input circuit, i.e., the antenna circuit, of the tuner and consists of a tunable leg of a tunable parallel bandpass filter. The circuit of the invention utilizes discrete components which may be selected with precision and controlled over the tuning range to maintain the image frequency trap at the appropriate frequency.

OBJECTS OF THE INVENTION

A principal object of the invention is to provide an improved UHF television tuner.

Another object of the invention is to provide a UHF tuner with improved image frequency rejection.

BRIEF DESCRIPTION OF THE DRAWINGS

These and other objects and advantages of the invention will become apparent upon reading the following description in conjunction with the drawings in which:

FIG. 2 is a frequency response waveform illustrating the effects of the image frequency trap of the invention; and FIG. 3 is a schematic showing of the equivalent bandpass and trap circuits and equations for deriving the needed component values for the circuit of the invention.

DESCRIPTION OF THE PREFERRED EMBODIMENT

Figure 1:
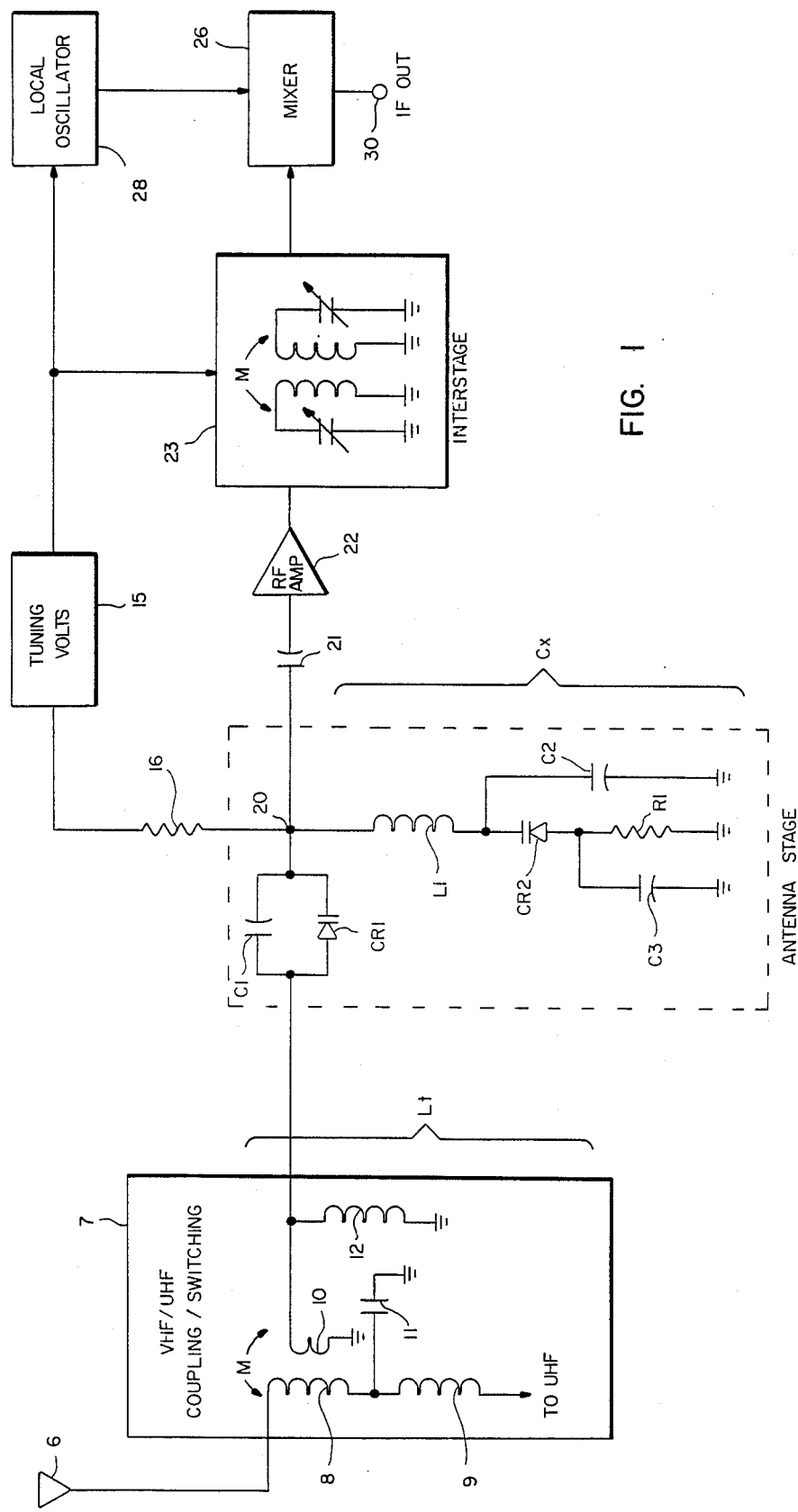
FIG. 1 is a partial schematic diagram of a television tuner constructed in accordance with the invention.

In the FIG. 1 schematic, an antenna 6 is connected to a block 7, labelled UHF/VHF COUPLING AND SWITCHING, which may include any of a wide variety of well-known coupling and splitter mechanisms for separating UHF and VHF (very high frequency) signals. For example, the arrangement may include electrical switching with diodes, capacitive, inductive or mutual coupling. The arrangement not only couples input signals to the UHF and VHF (not shown) tuner sections, but provides isolation therebetween. In the preferred embodiment, an antenna transformer is used and is formed by mutually coupled coils 8 and 10. Coil 8 is connected in series with another coil 9 that is, in turn, connected to the UHF tuner, not shown. The junction of coil 8 and coil 9 is connected by means of a coupling capacitor 11 to ground. Provision of the mutually coupled coils 8 and 10 eliminates the need for electrical switching between UHF and VHF in the input stage. A coil 12 is coupled in parallel with coil 10. The output of block 7 is connected to a varactor diode CR1 that is connected in parallel with a trim capacitor C1. Diode CR1 and capacitor C1 are connected to a junction 20 which is supplied through a bias resistor 16 with a DC tuning voltage from a tuning voltage source 15. A coil L1 is connected from junction 20 in a series circuit with another varactor diode CR2 and a resistor R1 to ground. A trim capacitor C2 is connected to the junction of L1 and varactor diode CR2 to ground and a trim capacitor C3 is coupled across resistor R1. The circuit leg between junction 20 and ground is also labelled Cx. It is the impedance changes in this leg which provide capacitance for the bandpass response for channel frequencies and a series resonant trap for the trap response at the image frequency.

For simplicity, Lt is used to denote the equivalent inductance across the input of the antenna stage. Junction 20 is connected through a coupling capacitor 21 to an RF amplifier 22. The antenna stage (elements within the dashed line box) provides an impedance match between the antenna impedance (Zin) and the RF amplifier input impedance (Zout). RF amplifier 22 is coupled through an interstage tuned circuit 23 to a mixer 26. A local oscillator 28 is coupled to mixer 26 and the IF signal output is taken from mixer 26 and supplied to an output terminal 30. Tuning voltage is also applied to interstage tuned circuit 23 and to oscillator 28 from tuning voltage source 15, which is conventional. The equation for the impedance of capacitance Cx is given in FIG. 3 and may be used to determine the value of Cx based upon the desired circuit parameters.

The waveform in FIG. 2 plots gain versus frequency and illustrates the bandpass characteristic (A) about a tuned channel carrier frequency. The dashed line portion B indicates the effect on the waveform A of the image frequency trap. For a 45 MHz IF frequency, this trap is located at the channel carrier frequency plus 88 MHz (44 MHz above the local oscillator frequency).

In FIG. 3, a portion of the input circuit is redrawn with capacitance Cx shown in equivalent form. This portion is labelled Bandpass Circuit. Junction 20 is connected to ground through capacitance Cx. The trap portion of the input circuit is also shown. The equations relating the channel bandpass frequency Fbp and trap frequency Ft with Lt, CR1, C1, Zout, Ctotal and Cx and for determining Fbp and Ft are given. Those skilled in the art will note that the bandpass circuit resembles a tapped capacitance matching network and will have a response characteristic generally corresponding to curve A in FIG. 2. The trap circuit is a series resonant leg, consisting of L2, CR2, R1, C2 and C3 and represents the impedance from junction 20 to ground at the image frequency. R1 effectively results in a lowering of the "Q" of capacitor C3, but is required to provide a DC ground for varactor diode CR2.

By adjusting C2 and C3 the trap can be made to track about 88 MHz above the channel frequency, with good accuracy, across the entire band. C3 primarily affects the trap frequency at the low end of the band and capacitor C2 primarily affects the trap frequency at the high end of the band. The equations for Fbp and Ft are simultaneously solved for required component values. The result is that the trap frequency may be made to track the channel frequency as the tuner is tuned across the UHF band. (It will also be appreciated that, since the components are discrete, their values are predictably controllable with time and temperature.)

It is recognized that numerous modifications and changes in the described embodiment of the invention may be made by those skilled in the art without departing from its true spirit and scope. The invention is to be limited only as defined in the claims.

What is claimed is:

1. In a television signal tuner of the type having a varactor diode-tuned bandpass filter input circuit and varactor diode-tuned interstage filter and oscillator circuits for providing a fixed frequency IF output signal in response to television signals of differing carrier frequencies, the improvement comprising:
   a tunable trap circuit in the bandpass filter for restricting image frequency input signals, said tunable trap circuit functioning as a tapped capacitance matching network for said television signal carrier frequencies and as a low impedance capacitance shunt at said image frequency.

2. The tuner of claim 1 wherein said capacitance shunt comprises an inductor, a varactor diode and a resistor connected in series; a first trim capacitor connected across said resistor and a second trim capacitor connected across the combination of said resistor and said varactor diode.

3. A television signal tuner comprising:
   a source of DC tuning voltage;
   an input circuit for receiving UHF television signals;
   an inductor;
   a first varactor diode connected between said input circuit and said inductor and coupled to said source of DC tuning voltage;
   an amplifier coupled to the junction of said first varactor diode and said inductor;
   a second varactor diode and a resistor connected in series with said inductor;
   a first trim capacitor connected across said resistor; and
   a second trim capacitor connected across the combination of said second varactor diode and said resistor.

4. The tuner of claim 3, further including a tunable oscillator; a mixer and a tunable interstage; said tunable interstage being coupled between said amplifier and said mixer; said oscillator supplying signals to said mixer and said source of tuning voltage being coupled to said oscillator and said interstage.

* * * * *